US006723495B2

(12) United States Patent
Ray et al.

(10) Patent No.: US 6,723,495 B2
(45) Date of Patent: Apr. 20, 2004

(54) WATER-DEVELOPABLE NEGATIVE-WORKING ULTRAVIOLET AND INFRARED IMAGEABLE ELEMENT

(75) Inventors: Kevin Ray, Fort Collins, CO (US); Paul Kitson, Evans, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 43 days.

(21) Appl. No.: 10/057,518

(22) Filed: Jan. 24, 2002

(65) Prior Publication Data

US 2003/0148227 A1 Aug. 7, 2003

(51) Int. Cl.⁷ .................................................. G03C 5/00
(52) U.S. Cl. ...................... 430/322; 430/171; 430/176; 430/905; 430/330; 430/994; 430/964
(58) Field of Search ................................ 430/322, 171, 430/176, 905, 330, 944, 964

(56) References Cited

U.S. PATENT DOCUMENTS

| | | |
|---|---|---|
| 3,779,778 A | 12/1973 | Smith et al. |
| 4,340,699 A | 7/1982 | Grouiller .................... 430/302 |
| 4,425,405 A * | 1/1984 | Murakami et al. .......... 428/342 |
| 4,687,727 A | 8/1987 | Toyama et al. .............. 430/175 |
| 5,372,907 A | 12/1994 | Haley et al. ................. 430/157 |
| 5,401,603 A | 3/1995 | Bodager et al. ............. 430/158 |
| 5,466,557 A | 11/1995 | Haley et al. ................. 430/278 |
| 5,919,601 A | 7/1999 | Nguyen et al. ........... 430/278.1 |
| 5,965,319 A | 10/1999 | Kobayashi .................. 430/176 |
| 6,042,987 A | 3/2000 | Kobayashi ............... 430/270.1 |
| 6,083,658 A | 7/2000 | Kunita et al. ............ 430/270.1 |
| 6,265,136 B1 | 7/2001 | Ray et al. .................... 430/302 |
| 6,316,161 B1 | 11/2001 | Obayashi et al. ........ 430/280.1 |
| 6,331,375 B1 | 12/2001 | Kawamura et al. ...... 430/270.1 |

FOREIGN PATENT DOCUMENTS

| | | | |
|---|---|---|---|
| EP | 000819985 A1 * | 1/1998 | ........... G03F/7/038 |
| JP | 03-291655 | 12/1991 | |
| JP | 10-193554 | 7/1998 | |
| JP | 11-153859 | 6/1999 | |

* cited by examiner

*Primary Examiner*—Mark E Huff
*Assistant Examiner*—Daborah Chacko-Davis
(74) *Attorney, Agent, or Firm*—RatnerPrestia

(57) ABSTRACT

Negative-working, water-developable imageable elements, useful as printing plate precursors, and methods for their use, are disclosed. The elements can be imaged with ultraviolet radiation, with infrared radiation, or with heat. The elements contain an imageable composition that contains a latent Brönsted acid, a water-soluble or water-dispersible binder, and an acid-activated cross-linking agent.

28 Claims, No Drawings

WATER-DEVELOPABLE NEGATIVE-WORKING ULTRAVIOLET AND INFRARED IMAGEABLE ELEMENT

FIELD OF THE INVENTION

This invention relates to lithographic printing. In particular, this invention relates to negative-working, water-developable, infrared and ultraviolet imageable elements useful as lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged imageable element. The most common method for removing the undesired regions is to contact the imaged element with a developer, which is typically an aqueous alkaline solution. If after exposure to radiation the exposed regions of the layer are removed by the developer revealing the underlying hydrophilic surface of the substrate, the element is a positive-working element. Conversely, if the unexposed regions are removed, the element is a negative-working element. In each instance, the regions of the imageable layer (i.e., the image areas) that remain after development are ink-receptive, and the regions of the hydrophilic surface revealed by the developing process accept water and aqueous solutions, typically a fountain solution, and repel ink.

During the development process, the developer becomes loaded with components of the imageable layer that have been removed during development. Once the developer becomes fully loaded, scum will form on the developed printing plates and on the components of the processor. The developer then must be replaced with fresh developer and the loaded developer disposed of.

Because of environmental considerations, the loaded alkaline developers, many of which also contain organic solvents, must be treated before disposal to render them non-hazardous. If the imageable element could be developed with water, rather with an alkaline developer, it would be unnecessary to treat alkaline developers before disposal. Thus, a need exists for imageable elements that can be developed with water, rather than with alkaline developers.

SUMMARY OF THE INVENTION

In one aspect the invention is a method for forming an image using a water-developable negative-working ultraviolet and infrared imageable element. The method comprises the steps of:

(a) imaging the imageable element and forming an imaged imageable element comprising imaged regions and unimaged regions in an imageable layer;

in which:
    the imageable element is imaged either with ultraviolet radiation, with infrared radiation, or with heat,
    the imageable element comprises:
        a substrate comprising a hydrophilic surface, and the imageable layer over the hydrophilic surface, and
    the imageable layer comprises an imageable composition that comprises:
        a latent Brönsted acid,
        a water-soluble or water-dispersible binder, and
        an acid-activated cross-linking agent;

(b) heating the imaged imageable element; and (c) developing the imaged imageable element with water and removing the unimaged regions.

When the element is imaged with infrared radiation, the imageable composition typically additionally comprises a photothermal conversion material.

DETAILED DESCRIPTION OF THE INVENTION

Imageable Elements

The imageable elements comprise an imageable layer over the hydrophilic surface of a substrate. Preferably the imageable layer is on the hydrophilic surface of the substrate. Preferably no other layers are present.

Substrate

The hydrophilic substrate, i e., a substrate that comprises at least one hydrophilic surface, comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 860 $\mu$m. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The back side of the substrate (i.e., the side opposite the underlayer and imageable layer) may be coated with an antistatic agent and/or a slipping layer or matte layer to improve handling and "feel" of the imageable element.

Imageable Layer

The imageable layer comprises an imageable composition. The imageable composition comprises a latent Brönsted acid which is capable of forming a Brönsted acid by the action of either heat or light, a water-soluble or water-dispersible binder, an acid-activated cross-linking agent, and optionally and typically a photothermal conversion material.

Useful latent Brönsted acids are precursors that form a Brönsted acid both by thermally initiated decomposition and by photochemically initiated decomposition. Latent Brönsted acids include, for example, onium salts in which the cation is iodonium, sulphonium, diazonium, phosphonium, oxysulphoxonium, oxysulphonium, sulphoxonium, selenonium, arsonium, or ammonium, and the anion is a non-nucleophilic anion selected from, for example, tetrafluoroborate, hexafluorophosphate, hexafluoroantimonate, triflate, tetrakis(pentafluorophenyl)borate, pentafluoroethyl sulfonate, p-methyl-benzyl sulfonate, ethyl sulfonate, trifluoromethyl acetate, and pentafluoroethyl acetate. Non-ionic latent Brönsted acids include, for example, haloalkyl-substituted s-triazines, which are described, for example, in Smith, U.S. Pat. No. 3,779,778. Examples of onium salts are diphenyliodonium hexafluorophosphate; triphenylsulfonium hexafluoroantimonate; and phenylmethyl-ocyanobenzylsulfonium trifluoromethane sulfonate. Water-soluble latent Brönsted acids, such as water-soluble onium salts, are preferred.

Water soluble diazonium salts that comprise one diazonium group (i.e., non-polymeric diazonium salts), such as 2-methoxy-4-aminophenyl diazonium hexafluorophosphate, 4-(dimethylamino)benzenediazonium tetrafluoroborate, and 4-(diethylamino)benzenediazonium tetrafluoroborate, which provide equivalent sensitivity to other latent Brönsted acids in the infrared region and higher sensitivity in the ultraviolet region, are particularly preferred onium salts. Diazonium polycondensation products, such as those prepared, for example, by condensation of a diazo monomer, such as is described in Toyama, U.S. Pat. No. 4,687,727 with a condensation agent, such as formaldehyde, acetaldehyde, propionaldehyde, butyraldehyde, isobutyraldehyde or benzaldehyde may also be used. Typical diazonium polycondensation products are the reaction products of diphenylamine-4-diazonium salts, optionally having a methoxy group on the phenyl group bearing the diazo group, with formaldehyde or with 4,4'-bis-methoxymethyl diphenyl ether, such as the 4-(phenylamino)benzenediazonium phosphate (1:1) formaldehyde polymer and the 4-(phenylamino) benzenediazonium sulfate (1:1) formaldehyde polymer.

The imageable composition comprises a water-soluble or water-dispersible binder. The water-soluble or water-dispersible binder produces an imageable composition that is removable with water prior to imaging. Water-soluble or water-dispersible binders that contain functional groups that can be cross-linked by the acid-activated cross-inking agent, such as —OH, —NH, —COOH and/or —COO$^-$, can be used. However, it is not necessary that the binder be cross-linkable. The binder should be of sufficient molecular weight, have a sufficiently high glass transition temperature, and be present in sufficient amount that the imageable layer is a substantially solid layer.

Suitable water-soluble or water-dispersible binders include, for example, (1) alginic acid and its water-soluble derivatives, propylene glycol alginates, propylene glycol esters of alginic acid, amine alginates, algin acetate, algin sulfate esters, the sodium, potassium, and/or ammonium salts of alginic acid; (2) water-soluble cellulose ethers, such as methyl cellulose, hydroxypropylmethyl cellulose, hydroxybutylmethyl cellulose, hydroxyethylmethyl cellulose, ethylhydroxyethyl cellulose, hydroxyethyl cellulose, hydroxypropyl cellulose, carboxymethyl cellulose, sodium carboxymethylcellulose, (3) carrageenan and its sodium, potassium and/or ammonium salts; (4) water-soluble biopolymers, such as guar gum, agar, gum arabic, gum ghatti, gum karaya, gum tragacanth, locust bean gum, (5) pectins and partially methoxylated polygalacturonans; (6) polyacrylamides; (7) polymers and copolymers of acrylic acid and/or methacrylic acid and their salts, including poly(methacrylic acids)and polyacrylic acid and their salts, such as their sodium, potassium, and/or ammonium salts; copolymers of methacrylic acid with maleic anhydride, itaconic acid and/or acrylamide and their salts, such as their sodium, potassium, and/or ammonium salts, and copolymers of methacrylic acid with methyl vinyl ether and their salts, such as their sodium, potassium, and/or ammonium salts; (8) polyethylene glycol and poly(ethylene oxide); (9) polyvinyl alcohol, partially hydrolyzed polyvinyl acetate, and vinyl alcohol copolymers; (10) poly(2-ethyl-oxazoline); (11) polyvinyl pyrrolidone; and (12) vinylpyrrolidone copolymers, such as vinylpyrrolidone/vinyl acetate copolymers. Preferred binders are vinylpyrrolidone/vinyl acetate copolymers. Phenolic resins, such as resole resins, novolac resins, and polyvinyl phenols, can not be used in the imageable elements of the invention because they do not produce water-developable compositions.

The imageable composition comprises an acid-activated cross-linking agent or cross-linking resin. When the imaged element is heated, the cross-linking agent crosslinks with itself in the exposed regions. If a cross-linkable binder is present, it also cross-links with the cross-linkable binder in the exposed regions. This "hardens" or insolubilizes the exposed regions so that they are not removed during development. The cross-linking agent may cross-link to itself and form a matrix that entraps and insolubilizes the binder and/or it may cross-link the binder.

The crosslinking agent must be acid-activated so that it insolubilizes the binder only in the exposed regions of the imageable layer during the heating step. Cross-linking agents that form cross-links on heating in the absence of acid, such as those that contain epoxy and/or imino groups, can not be used in the imageable compositions of the invention.

Acid-activated cross-linking agents include, for example, (1) hexamethoxymethyl melamines, (2) ethoxymethoxy melamine formaldehydes, (3) melamine resins, and (4) high solids urea resins. Preferred acid-activated cross-linking agents are hexamethoxymethyl melamines.

When the element is to be thermally imaged with infrared radiation, the imageable composition comprises an absorber referred to as a photothermal conversion material. Photothermal conversion materials absorb radiation and convert it to heat. Photothermal conversion materials may absorb ultraviolet, visible, and/or infrared radiation and convert it to heat. Preferably, the photothermal conversion material has a high extinction coefficient in the range of 750 nm to 1200 nm. More preferably, the infrared absorption maximum of the photothermal conversion closely matches the wavelength of the infrared radiation used for thermal imaging, typically about 830 nm or about 1056 nm.

The photothermal conversion material may be either a dye or pigment, such as a dye or pigment of the squarylium, merocyanine, indolizine, pyrylium, or metal diothiolene class. Examples of absorbing pigments are Projet 900, Projet 860 and Projet 830 (all available from the Zeneca Corporation), and carbon black. Absorbing dyes are disclosed in numerous publications, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectralR 840A (Spectra Colors), and Trump IR Dye (Eastman Kodak, Rochester, N.Y.).

Other ingredients that are conventional components of imageable compositions may be present in the imageable composition provided they do not adversely affect the water developability of the imageable element. These include, for example, surfactants, inert colorants and plasticizers. Colorants include, for example, Oil Yellow #101, Oil Pink #312, Oil Black BY, Crystal Violet (C.l. 42555), Methylene Blue (C.l. 52015), and Rhodamine B (C.l. 145170B). When present, typically about 0.01 to about 10 wt %, more typically about 0.1 to about 5 wt %, based on the weight of the imageable composition, of colorant is present in the imageable layer. Plasticizers include, for example, polyethylene glycol, tributyl phosphate, dihexyl phthalate, dioctyl phthalate, and tricresyl phosphate. When present, typically about 0.1 to about 10 wt %, more typically about 1 to 5 wt %, based on the weight of the imageable layer, of plasticizer is present in the imageable composition. Surfactants include, for example, sorbitan tristearate, sorbitan monopalmitate, sorbitan triolate, and di(aminoethyl)glycine.

When present, typically about 0.05 to about 15 wt %, more typically about 0.1 to 5 wt %, based on the weight of the imageable layer, of surfactant is present in the imageable composition. In addition, sensitizers that increase the sensitivity of the latent Brönsted acid to ultraviolet and/or visible radiation may be present. These sensitizers are well known. Sensitizers for onium salts are described, for example, in Crivello, U.S. Pat. No. 4,026,705; Smith, U.S. Pat. No. 4,069,054; Smith, U.S. Pat. No. 4,250,053; Smith, U.S. Pat. No. 4,394,403; and Devoe, U.S. Pat. No. 4,792,506.

The imageable composition typically comprises about 20 to 70 wt %, preferably about 30 to 55 wt % of the binder; about 1 to 40 wt %, preferably 5 to 25 wt % of the latent Brönsted acid; about 1 to 15 wt %, preferably 3 to 10 wt % of the photothermal conversion material, about 20 to 50 wt %, preferably 25 to 45 wt % of the crosslinking resin, and 0 to about 15 wt % of other ingredients. The imageable layer typically has a coating weight of about 0.5 to 2.5 g/m$^2$, preferably coating weight of about 1.0 to 2.0 g/m$^2$.

The imageable element may be prepared by methods well known in the art. The imageable layer may be applied to the substrate by, for example, coating, lamination, or extrusion. Typically the ingredients of the imageable layer are dispersed or dissolved in a suitable coating solvent or mixture of solvents, and the resulting mixtures coated by conventional methods, such as spin coating, bar coating, gravure coating, or roller coating.

Imaging and Processing

Thermal imaging may be carried out with a laser or an array of emitting modulated near infrared or infrared radiation in a wavelength region that is absorbed the element. Infrared radiation, especially infrared-radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as the CREO® Trendsetter (CREO Corp., Bumaby, Britsh Columbia, Canada) and a Gerber Crescent 42T (available from the the Gerber Corporation). Preheatng of the imageable element is not-required.

Alternatively, the element may be imaged using a conventional apparatus containing a heated stylus or thermal printing head. A suitable commercially available hot stylus imaging device is the GS 618-400 Thermal Plotter (Oyo Instruments, Houston, Tex., USA). When exposure is carried out with a thermal head, it is unnecessary that the element comprise a photothermal conversion material. However, elements that absorb infrared radiation can be imaged with a thermal head.

The element can also be imaged to form continuous or halftone images by ultraviolet exposure through a suitable imaging master or photomask, such as a silver halide film. Any convenient source or sources of actinic radiation providing wavelengths in the region of the spectrum that overlap the absorption bands of the latent Brönsted acids can be used to activate the photoreaction. Conventional light sources, which are used with a photomask, include fluorescent lamps, mercury vapor lamps, metal additive lamps, carbon arc lamps, tungsten filament lamps and photoflood lamps. Alternatively the element may be digitally imaged with a laser emitting in the ultraviolet, such as a xenon, argon ion, or ionized neon laser, a tunable dye laser, or a frequency doubled neodymium: YAG laser.

Because the imageable element is sensitive to both infrared and ultraviolet radiation, the same element can be used in equipment intended for input of data in digital form by imaging with a laser and in equipment that is used for analog imaging by ultraviolet imaging through a photomask. Thus, both digital and analog imaging can be used on the same imageable element. For example, information not available in an electronic format can be added to a digitally imaged element using ultraviolet imaging through a photomask.

Following imaging, the imaged element is heated at a temperature of from about 75° C. to about 150° C. for a period of from about 15 to about 300 seconds. Preferably, the imaged element is heated for about 30 to about 90 seconds at a temperature from about 90° C. to about 110° C.

Imaging of the imageable element produces an imaged element, which comprises a latent image of imaged and unimaged regions. Developing the exposed element to form a developed element converts the latent image to an image by removing the unexposed regions of the imageable layer, revealing the hydrophilic surface of the underlying substrate. The element is negative working, in that the imageable layer is removed in the unexposed regions. The exposed regions become the ink accepting regions in the resulting lithographic printing plate.

The element is developed with water. Deionized water or distilled water may be used, but is not required provided that the water does not contain ingredients that interfere with the development process or react with the ingredients of the imageable layer to form scum on the printing plate. Although the imaged element may be developed in warm water, cold water is preferred. Development is carried for a long enough time to dissolve or otherwise remove the unexposed regions of the imageable layer, but not long enough to remove the exposed regions of the imageable layer. Typically water is applied to the imaged element by rubbing or wiping the top layer with an applicator containing water. Alternatively, the imaged element may be brushed with water or water may be applied to the element by spraying the top layer with sufficient force to remove the exposed regions. In either instance, a developed element is produced.

Industrial Applicability

The elements and methods of the invention can be used to produce lithographic printing plates. Printing can then be carried out by applying a fountain solution and then a lithographic ink to the image on the surface of the imaged and developed element, i.e., the lithographic printing plate. The unimaged regions, i.e., the hydrophilic surface of the substrate exposed by the imaging and development process, take up the fountain solution. The imaged regions take up the ink.

The ink is then transferred to a suitable receiving material (such as cloth, paper, metal, glass or plastic) either directly or indirectly through the use of an intermediate offset printing blanket to produce an impression of the image on the receiving material. The printing plate and/or the blanket can be cleaned between impressions, if desired, using conventional cleaning means.

The advantageous properties of this invention can be observed by reference to the following examples, which illustrate but do not limit the invention.

EXAMPLES

Glossary

Cymel-303 Hexamethoxymethylmelamine (American Cyanamid, Wayne, N.J., USA)
Diazo MSPF 2-Methoxy4-aminophenyl diazonium hexafluorophosphate (Diversitec, Ft. Collins, Colo., USA)
IR Dye A Trump IR Dye; Infrared absorbing dye ($\lambda$Max= 830 nm) (Eastman Kodak, Rochester, N.Y., USA)
PVPNA 50% solution of a vinylpyrrolidone/vinyl acetate copolymer (50:50) in 2-propanol (GAF, Wayne, N.J., USA)

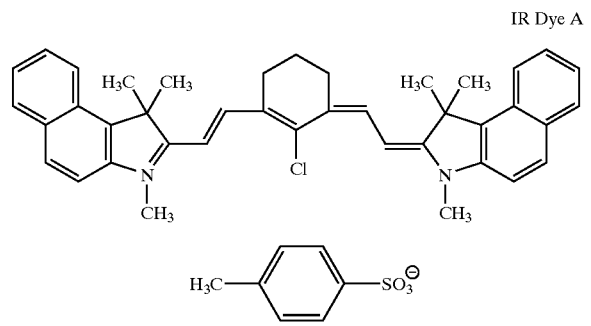

IR Dye A

These examples illustrate preparation, imaging, and development of imageable elements.

Coating solutions were prepared by dissolving the ingredients listed in Table 1 in dimethylformamide (8.8% solids). To prepare imageable elements, the solutions were coated onto a substrate of 0.3 mm thick aluminum sheet that has been electrograined, anodized and subject to treatment with a solution of polyvinylphosphonic acid with a wire wound bar and dried at 130° C. for 1 min. The coating weights, measured after the imageable elements had air dried for several days, were about 1.8 g/m².

TABLE 1

| Component[a] | Example 1 | Example 2 | Example 3 |
|---|---|---|---|
| IR Dye A | 10 | 9 | 6 |
| Diazo MSPF6 | 10 | 18 | 25 |
| Cymel 303 | 30 | 28 | 38 |
| PVP/VA | 50 | 45 | 31 |

[a]Parts by weight

Each imageable element was tested for water developability. A sample of each element was drenched in tap water for 10 sec, rubbed with a wet cotton pad for a further 10 sec and dried. Each sample was dissolved by water.

A sample of each imageable element was exposed to 250 mJ/cm² of ultraviolet through a mask. Exposure was carried out using an OLEC A1 985 contact light frame (Millington Machine Co., Torrance, Calif.) equipped with a light integrator. Each sample was heated in an oven at 130° C for 1 min and developed with water as described above. In each sample the exposed regions remained after development, leaving an accurate copy of the mask image.

A sample of each imageable element was imaged using an internal test pattern with a Creo® Trendsetter (CREO, Burnaby, BC, Canada) thermal exposure device having laser diode array emitting at 830 nm with an imaging energy density of 300 mJ/cm². Each sample was heated in an oven at 130° C. for 1 min and developed with water as described above. In each sample the exposed regions remained after development, leaving an accurate copy of the mask image. The ample from Example 1, for example, appeared to be at least 2–98% dots at 150 lines per inch.

The printing plates produced by thermal imaging of Examples 1 and 3 were each mounted on A.B. Dick 9870 duplicator press. A commercial black lithographic ink and Varn Universal Pink Fountain Solution were used in the press test. Each plate accepted ink and successfully printed at least 1,000 impressions.

Having described the invention, we now claim the following and their equivalents.

What is claimed is:

1. A method for forming an image, the method comprising the steps of:
   (a) imaging an imageable element and forming an imaged imageable element, the imaged imageable element comprising imaged regions and unimaged regions in an imageable layer;
   in which:
      the imageable element is imaged either with ultraviolet radiation, with infrared radiation, or with heat,
      the imageable element comprises:
         a substrate comprising a hydrophilic surface, and
         the imageable layer over the hydrophilic surface, and
         the imageable layer comprises an imageable composition that comprises:
            a latent Brönsted acid,
            a water-soluble or water-dispersible binder, and
            an acid-activated cross-linking agent;
   (b) heating the imaged imageable element; and
   (c) developing the imaged imageable element with water and removing the unimaged regions.

2. The method of claim 1 in which the water-soluble or water-dispersible binder is a vinylpyrrolidone/vinyl acetate copolymer.

3. The method of claim 2 in which the latent Brönsted acid is a water-soluble onium salt.

4. The method of claim 3 in which the latent Brönsted acid is a diazonium salt.

5. The method of claim 4 in which the acid-activated cross-linking agent is a melamine resin.

6. The method of claim 5 in which the imageable element is imaged with ultraviolet radiation.

7. The method of claim 5 in which the imageable composition additionally comprises a photothermal conversion material and the imageable element is imaged with infrared radiation.

8. The method of claim 5 in which the imageable element is imaged with heat.

9. The method of claim 1 in which the latent Brönsted acid is a water-soluble onium salt.

10. The method of claim 9 in which the latent Brönsted acid is a diazonium salt.

11. The method of claim 10 in which the acid-activated cross-linking agent is a melamine resin.

12. The method of claim 1 in which the acid-activated cross-linking agent is a melamine resin.

13. The method of claim 1 in which (i) the imageable composition additionally comprises a photothermal conversion material, and (ii) the imageable element is imageable with ultraviolet radiation, with infrared radiation, and with heat.

14. The method of claim 13 in which the water-soluble or water-dispersible binder is a vinylpyrrolidone/vinyl acetate copolymer.

15. The method of claim 14 in which the latent Brönsted acid is a water-soluble onium salt.

16. The method of claim 15 in which the latent Brönsted acid is a diazonium salt.

17. The method of claim 16 in which the acid-activated cross-linking agent is a melamine resin.

18. The method of claim 17 in which the water-soluble onium salt is 2-methoxy-4-aminophenyl diazonium hexafluorophosphate.

19. The method of claim 13 in which the latent Brönsted acid is a water-soluble onium salt.

20. The method of claim 19 in which the latent Brönsted acid is a diazonium salt.

21. The method of claim 20 in which the acid-activated cross-linking agent is a melamine resin.

22. The method of claim 13 in which the acid-activated cross-linking agent is a melamine resin.

23. An image formed by a method comprising the steps of:
  (a) imaging an imageable element and forming an imaged imageable element, the imaged imageable element comprising imaged regions and unimaged regions in an imageable layer;
  in which:
    the imageable element is imaged either with ultraviolet radiation, with infrared radiation, or with heat,
    the imageable element comprises:
      a substrate comprising a hydrophilic surface, and
      the imageable layer over the hydrophilic surface, and
    the imageable layer comprises an imageable composition that comprises:
      a latent Brönsted acid,
      a water-soluble or water-dispersible binder, and
    an acid-activated cross-linking agent;
  (b) heating the imaged imageable element; and
  (c) developing the imaged imageable element with water and removing the unimaged regions.

24. The image of claim 23 in which:
  the water-soluble or water-dispersible binder is a vinylpyrrolidone/vinyl acetate copolymer;
  the latent Brönsted acid is a water-soluble onium salt; and
  the acid-activated cross-linking agent is a melamine resin.

25. The image of claim 24 in which the water-soluble onium salt is a diazonium salt.

26. An imageable element comprising:
  a substrate comprising a hydrophilic surface, and
  an imageable layer over the hydrophilic surface,
  in which the imageable layer comprises an imageable composition that comprises a latent Brönsted acid, a water-soluble or water-dispersible binder, and an acid-activated cross-linking agent.

27. The imageable element of claim 26 in which:
  the water-soluble or water-dispersible binder is a vinylpyrrolidone/vinyl acetate copolymer;
  the latent Brönsted acid is a water-soluble onium salt; and
  the acid-activated cross-linking agent is a melamine resin.

28. The imageable element of claim 27 in which the water-soluble onium salt is a diazonium salt.

* * * * *